United States Patent
Gopinathan et al.

(10) Patent No.: US 6,222,418 B1
(45) Date of Patent: Apr. 24, 2001

(54) FEED-FORWARD COMPENSATION SCHEME FOR FEEDBACK CIRCUITS

(75) Inventors: Venugopal Gopinathan, Basking Ridge; Vladimir I. Prodanov, New Providence, both of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/515,533

(22) Filed: Feb. 29, 2000

(51) Int. Cl.$^7$ .................................................. H03F 1/14
(52) U.S. Cl. .............................................. 330/292; 330/98
(58) Field of Search ............................... 330/98, 99, 100, 330/124 R, 151, 292

(56) References Cited

U.S. PATENT DOCUMENTS

| | | | |
|---|---|---|---|
| 3,743,957 | * | 7/1973 | Feistel .................................... 330/85 |
| 3,851,259 | * | 11/1974 | Porawski ............................... 328/143 |
| 5,229,734 | * | 7/1993 | Wondra et al. ....................... 330/305 |
| 5,357,208 | * | 10/1994 | Nelson .................................. 330/126 |
| 5,485,121 | | 1/1996 | Huijsing et al. ..................... 330/260 |

* cited by examiner

Primary Examiner—Robert Pascal
Assistant Examiner—Henry Choe
(74) Attorney, Agent, or Firm—Darby & Darby

(57) ABSTRACT

A feed-forward compensated negative feedback circuit comprises an operational amplifier having an inverting and a non-inverting input and an output. A feedback element is connected between the output of the operational amplifier and its inverting input to form a negative feedback loop. The inverting input of the op-amp is driven with a first transconductance amplifier which produces an output current proportional to an input voltage. A feed-forward transconductance amplifier receives the input voltage and produces an inverted output current proportional to the input voltage. A feed-forward current is injected at the output of the operational amplifier. By providing at the output of the op-amp the current it would be required to carry over the feedback loop, a voltage differential at the op-amp inputs is avoided, thus eliminating parasitic current flows across the parasitic input capacitance and thereby improving the circuits overall performance. In a second embodiment of the invention, a unity-gain buffer is included in the feedback loop to produce a unidirectional path. To reduce the power requirements of the buffer, a feed-forward current is injected at a point between the feedback impedance element and the unity-gain feedback buffer such that the buffer does not need to source any current through the impedance element.

9 Claims, 4 Drawing Sheets

FEED-FORWARD COMPENSATION SCHEME FOR FEEDBACK CIRCUITS

TECHNICAL FIELD

This invention is related to an improved negative feedback op-amp circuit, such as a high performance integrator having an op-amp with low conductance for use in integrated circuits.

BACKGROUND OF THE INVENTION

Operational amplifiers in negative feedback arrangements are common circuit elements in analog integrated circuits. An ideal integrator circuit has infinite DC gain and a constant phase of −90°. However, due to non-idealities, these circuits have a finite gain and a phase shift which is different from −90° (henceforth called phase error). In particular, parasitic input and output capacitances introduce a extra poles in the transfer equation which produces unacceptable phase errors if the pole is too close to the unity gain frequency of the integrator.

This problem becomes particularly acute for high frequency applications which are implemented using MOS technologies. This is because the op-amps built using these technologies are usually single-stage circuits that are built with MOSFETS which have a limited transconductance. This limitation reduces the frequency of the parasitic pole.

A conventional feedback circuit is illustrated in FIGS. 1a and 1b. The circuit 10 comprises an operational amplifier 12 having trans-conductance $g_m$ and a transconductance amplifier 14 having trans-conductance $G_m$. Ideally, the transconductance amplifier 14 sources (or sinks) an output current equal to $G_m V_{in}$. A transconductance amplifier 14 is used instead of the more conventional resistor to ensure adequate DC gains for the integrator, which is the cascaded gains of the transconductor and the opamp. A feedback impedance 16 of magnitude Y is connected between the inputs and outputs of the op-amp 12. Also illustrated are the parasitic input and output capacitances $C_{pi}$ 18 and $C_{po}$ 20, respectively.

The frequency domain transfer function for this circuit 10 can be written as:

$$H_I(s) \approx \left[\frac{1}{s(Y/G_m)}\right]\left[\frac{1-s\left(\frac{Y}{g_m}\right)}{1+s\left(\frac{C_{po}+C_{pi}}{g_m}\right)}\right] \quad \text{(Equ. 1)}$$

The first term in the equation represents the transfer function for an ideal op-amp 12. The second term is a result of the non-ideal input and output capacitances combined with a non-infinite $g_m$. Because of the difference in sign between the numerator and denominator of the non-ideal equation component and the non-infinite $g_m$, the phase error terms of the pole and zero do not cancel and a net negative phase error is produced. The lower the value of $g_m$, the more significant the error introduced by these terms, and thus the more significant the impact of the pole/zero on the performance of this circuit and other circuits which include a similar feedback circuit design.

Because of the feedback loop, the op-amp 12 must generate the same current as provided by the transconductance amplifier 14. In addition, opamp 12 must also generate current to account for the current drawn by the parasitic capacitances. With reference to the current flows illustrated in FIG. 1b, the op-amp 12 must source an output current $I_O = I_F + I_{PO}$, where $I_{PO}$ is the current flow through the parasitic output capacitance $C_{PO}$ 20. Further, there is also an induced voltage $V_{PI}$ at the input to the op-amp 12, which produces an additional current $I_{PI}$. Thus, $I_F = G_m V_{IN} + I_{PI}$. In other words, some of the output current is "stolen" to supply the parasitic input and output capacitances, This difference results in detriments, such as phase error, which impact the performance of the circuit.

Various techniques have been employed to reduce the errors caused by these non-idealities. In one variation, a resistance is introduced in series with the feedback impedance 16. This provides some improvement at low frequencies, but is not particularly effective in high frequency situations. Alternative configurations make use of error detection devices which measure the output of the op-amp and adjust various circuit parameters by means of a control signal to compensate for the unwanted phase-shift. However, this technique can be cumbersome and requires relatively complex error detection and adaptive circuitry.

One particular solution for the case when the feedback impedance is a capacitor used for the purpose of Miller-compensating a transconductance stage has been implemented using a Multipath Miller Cancellation technique, such as described in U.S. Pat. No. 5,485,121 and discussed in R. Eschauzier and J. Huijsing, "An Operational Amplifier with Miller-Zero cancelation for RHP zero removal", ESSCIRC'93, European Solid-state Circuits Conference 1993, pp.122–125. This technique provides a parallel current path which is configured to bypass the Miller-compensated transductance stage and provide a current which compensates for the current directly passing through the Miller capacitor. However, the solution presented is restricted to Miller-compensated amplifiers and does not generally address the problems created by non-ideal amplifiers in negative feedback configurations with non-capacitive impedances.

An alternative solution is to introduce a unity-gain buffer 22 in the feedback loop between the output of the op-amp 12 and the impedance 16, such as shown in FIG. 1c. The purpose of the buffer 22 is to supply the feedback current $G_m V_{IN}$ instead of the op-amp 22 and thereby avoid introducing a voltage differential at the input of the op-amp 12 which results in a current drain into the parasitic input capacitance. However, the buffer 22 has a finite output impedance $R_O$ 24. Thus, the transfer function of this circuit is:

$$\frac{V_O}{V_I} = \left(-\frac{G_m}{Y}\right)(1 - YR_O) \quad \text{(Equ. 2)}$$

The first term in Equation 2 is the ideal behavior. The second term represents the error which results from the non-ideality of the buffer 22. In particular, the current $G_m V_{IN}$ produced by buffer 22 is forced to flow through the output impedance $R_O$ 24 as well as the feedback impedance 16. Thus, there is a voltage drop in the feedback path which degrades the performance of the circuit. Although the buffer 22 could be designed to have a very small output impedance, such a buffer would require substantially more power than is generally available for high-frequency, low power devices.

Accordingly, it would be advantageous to provide a generalized op-amp feedback circuit structure with compensation for input and output capacitances.

It would also be advantageous to provide an improved unity-gain buffered feedback circuit with compensation for the output resistance of the feedback buffer.

SUMMARY OF THE INVENTION

According to a first aspect of the invention, a feed-forward compensated negative feedback circuit is provided which comprises an operational amplifier with a conductance gm and having an inverting and a non-inverting input and an output. A non-capacitive impedance element is connected between the output of the operational amplifier and its inverting input to form a negative feedback loop. The inverting input of the op-amp is driven with a first transconductance amplifier having conductance Gm and which produces an output current proportional to an input voltage. A feed-forward transconductance amplifier with a conductance substantially equal to Gm receives the input voltage and produces an inverted output current proportional to the input voltage. The feed-forward current is injected at the output of the operational amplifier. By providing at the output of the op-amp the amount of current it would be required to carry over the feedback loop, a voltage differential at the op-amp inputs is avoided, thus eliminating parasitic current flows across the parasitic input capacitance and thereby improving the circuits overall performance.

In a second embodiment of the invention, the feed-forward current is injected into a unity-gain buffered feedback circuit at a point between the impedance element and the unity-gain feedback buffer. By providing the feedback current from an external source, the buffer does not need to source any current through the impedance element, thus eliminating any drop in the buffer's output impedance since no current needs to flow through it. Preferably, in both embodiments, the transconductance amplifiers are substantially identical to each other.

BRIEF DESCRIPTION OF THE DRAWINGS

The foregoing and other features of the present invention will be more readily apparent from the following detailed description and drawings of illustrative embodiments of the invention in which:

FIG. 1b is a schematic diagram illustrating the current flows in the circuit of FIG. 1a;

DETAILED DESCRIPTION OF THE PREFERRED EMBODIMENTS

Figure 2:
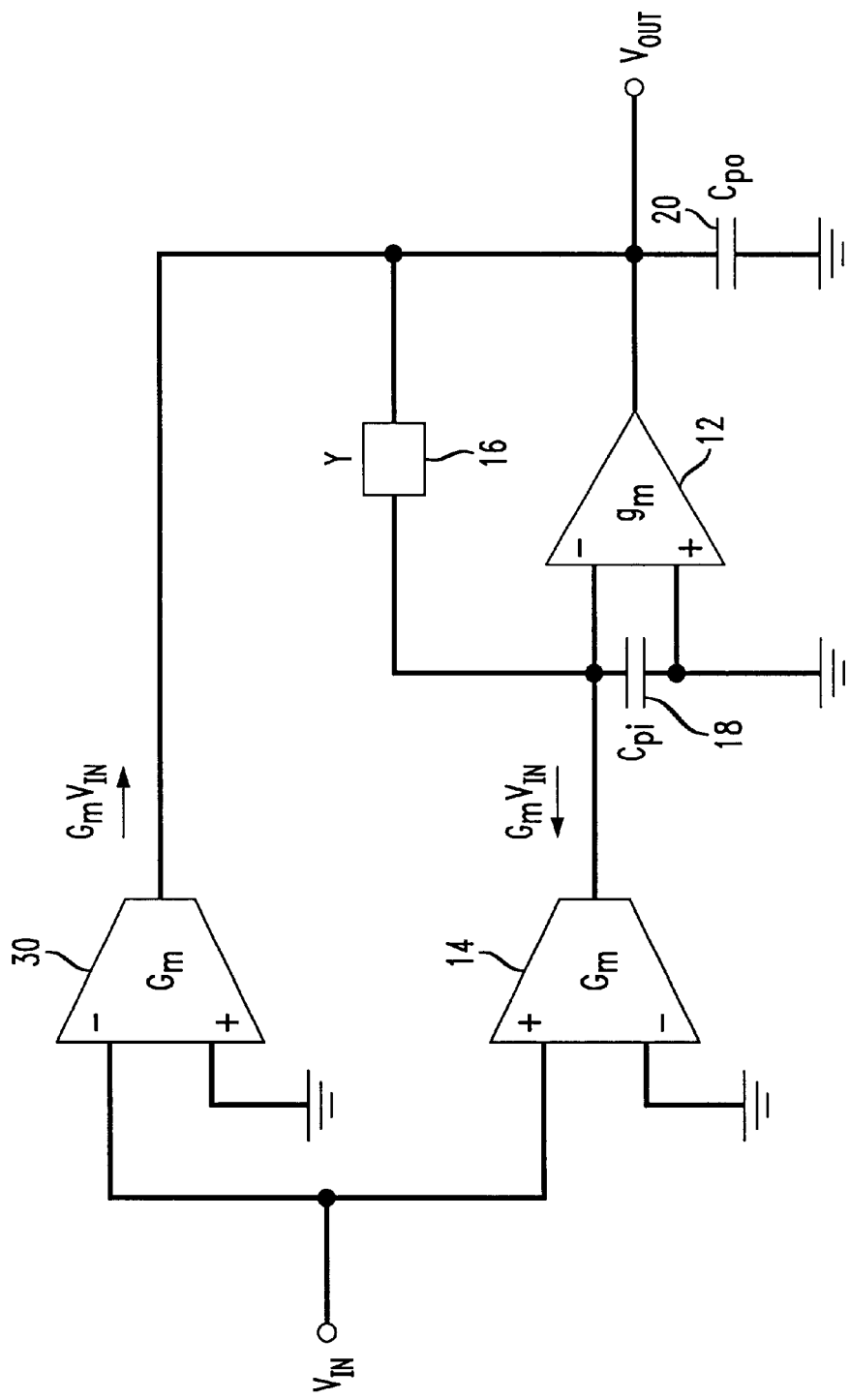
FIG. 2 is a schematic diagram of a feed-forward compensated negative feedback circuit according to a first embodiment of the invention.

Turning to FIG. 2, there is shown a schematic diagram of a feed-forward compensated negative feedback circuit according to a first embodiment of the invention. The circuit includes an operational amplifier 12 with conductance $g_m$ and having an inverting and a non-inverting input and an output. An impedance element 16, preferably a non-capacitive impedance, is connected between the output of the operational amplifier 12 and its inverting input. A first transconductance amplifier 14 with conductance $G_m$ receives an input signal Vin and has an output connected to the inverting input of the op-amp 12, which output sources or sinks a current of $G_m V_{IN}$. The parasitic input and output capacitances of the op-amp 12, $C_{pi}$ 18 and $C_{po}$ 20, respectively, are also illustrated.

According to the invention, a feed-forward transconductance amplifier 30 is provided which provides some, and preferably all of the feedback current which otherwise would have to be supplied by the op-amp 12. As can be appreciated, the current sourced or sunk by transconductance amplifier 14 is equivalent to the ideal feedback current. This feedback current can be duplicated by configuring the feed-forward transconductance amplifier 30 to be substantially equivalent to transconductance amplifier 14.

By injecting the required feedback current into the feedback loop, i.e., at the output of the op-amp 12, the op-amp 12 does not need to supply or sink the feedback current. Provided that the output impedance is negligible, the op-amp does not need to source or sink any current (since the feedback current is supplied externally) and thus, the op-amp 12 is forced into a state where the input voltage differential is zero. Because the inputs of the op-amp are necessarily at the same voltage, no parasitic currents are generated across the parasitic input capacitance $C_{pi}$. As a result, the circuit behaves as an ideal circuit having a transfer function $V_O/V_I = -G_m/Y$, which is independent of the value of the input capacitance.

For a non-negligible output impedance, such as capacitance $C_{po}$, the circuit performance is still significantly better than without the feed-forward current. Because the feedback current is supplied by the feed-forward transconductance amplifier 30, the only current which must be source or sunk by the op-amp 12 is that which flows through the output impedance. Mathematically, the resulting feed-forward transfer function can be written as:

$$H_{FFI}(s) \approx \left[\frac{1}{s(Y/G_m)}\right]\left[\frac{1 - s\left(\frac{C_{pi}}{g_m}\right)}{1 + s\left(\frac{C_{po} + C_{pi}}{g_m}\right)}\right] \quad \text{(Equ. 3)}$$

Figure 1A:
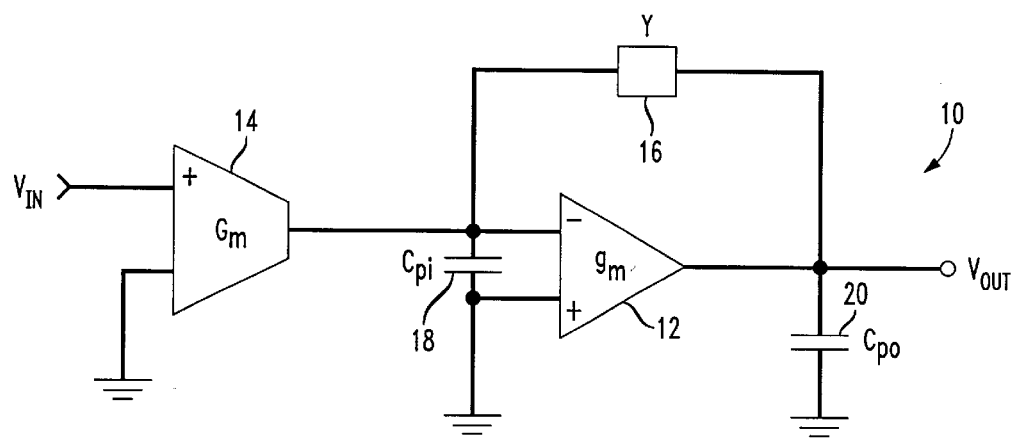
FIG. 1a is a schematic diagram of a conventional op-amp feedback circuit.
Figure 1B:
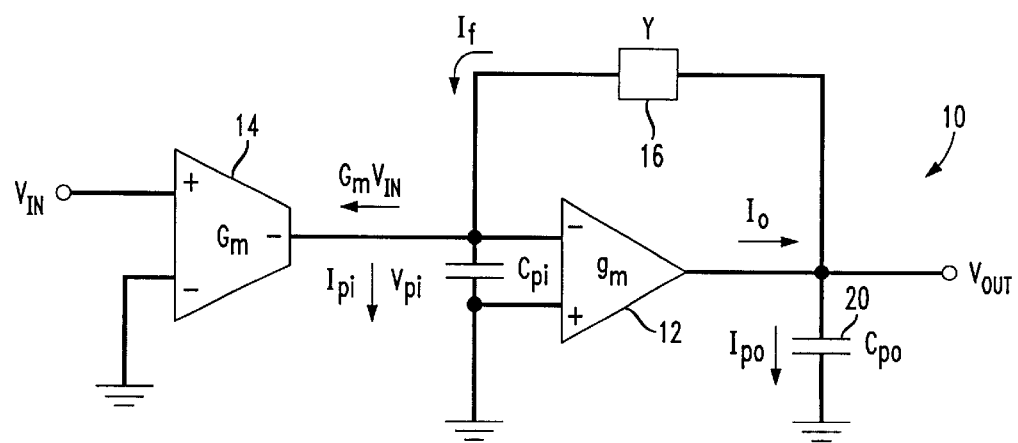
Figure 1C:
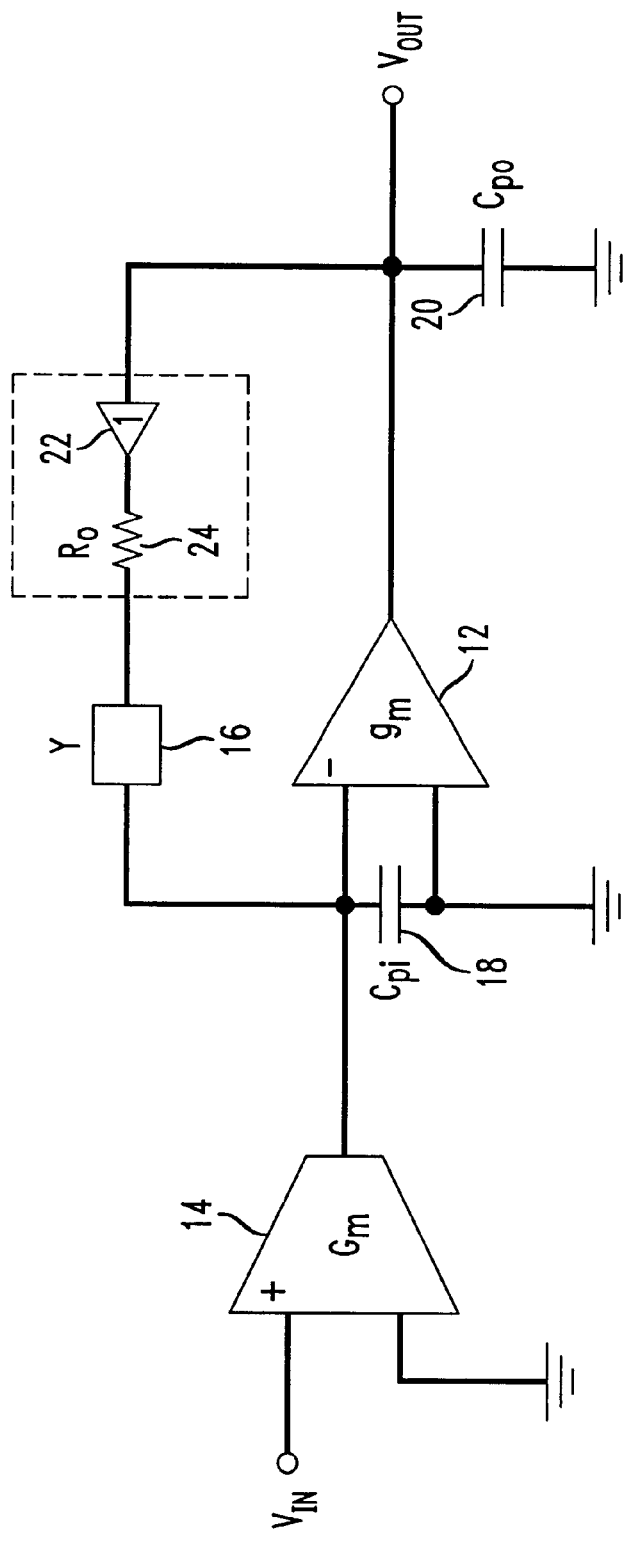
FIG. 1c is a schematic diagram of conventional unity-gain buffered feedback circuit.

If $C_{po}$ is small and $g_m$ is large, the error term approaches one, resulting in an ideal transfer function. (This result should be compared to the circuit of FIG. 1 and Equ. 1, where the error term does not cancel).

In a preferred embodiment, the op-amp 12 is a simple high-speed operational transconductance amplifier having a transconductance $g_m$ which is substantially larger than the $G_m$ of the input transconductance amplifiers 14. Most preferably, $g_m$ is at least 10-times greater than $G_m$.

Figure 3:
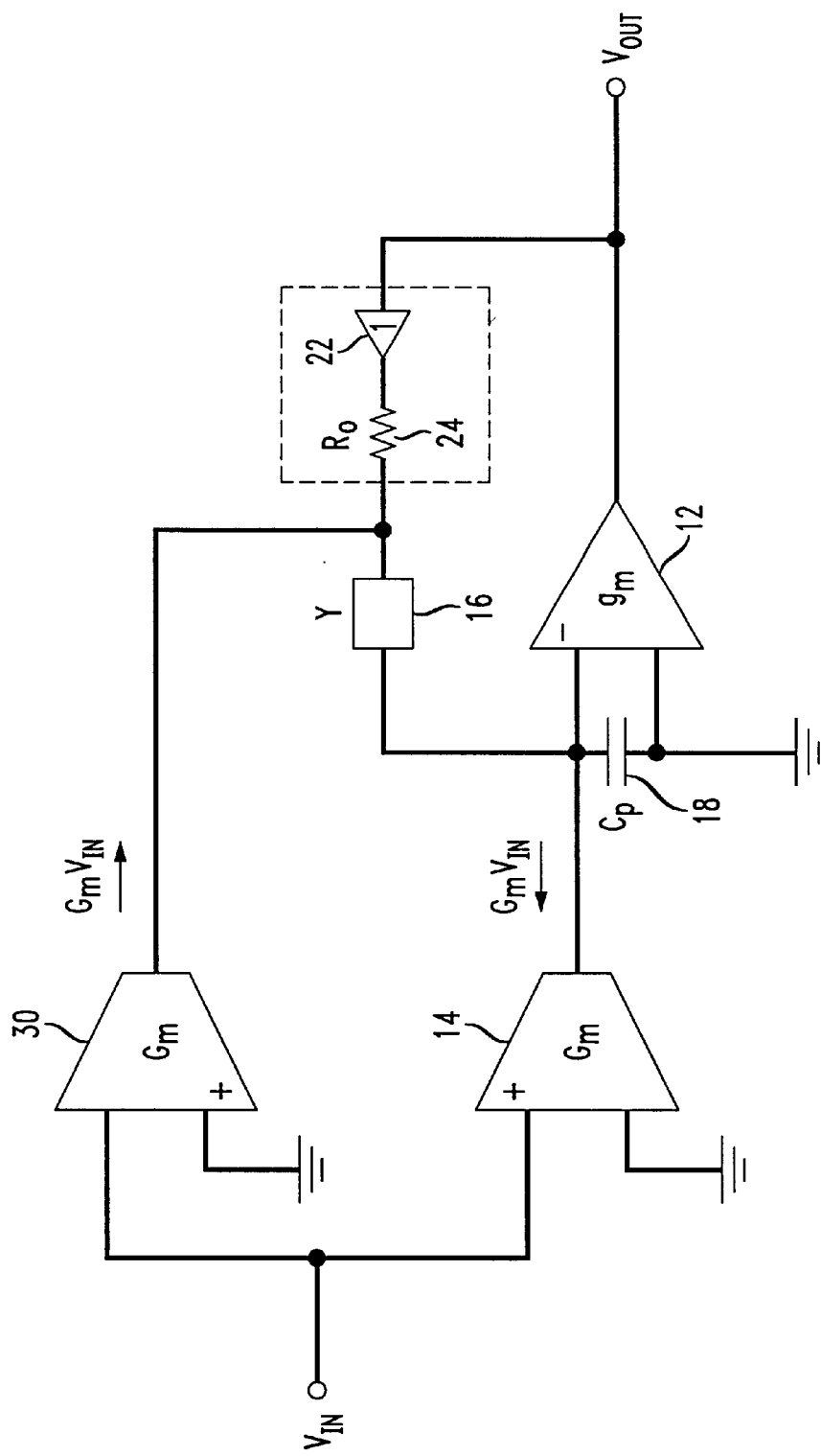
FIG. 3 is a schematic diagram of a feed-forward compensated negative feedback circuit according to a second embodiment of the invention.

Turning to FIG. 3, there is shown is a schematic diagram of a feed-forward compensated negative feedback circuit according to a second embodiment of the invention. The circuit includes an operational amplifier 12 with transconductance $g_m$, a negative feedback impedance 16 and a transconductance amplifier 14 with trans-conductance $G_m$ connected to the input of the op-amp 18 as shown. A unity gain buffer 22 having output impedance $R_O$ 24 is connected between the output of the op-amp 12 and the impedance 16. In conventional circuits, such a buffer may be introduced into the feedback loop to generate the feedback current such that the op-amp 12 does not need to generate it. However, when current flows, there is a voltage drop across the output impedance $R_O$ 24, degrading the performance of the circuit.

To address this problem, the output of a feed-forward transconductance amplifier 30, having a conductance substantially equal to $G_m$ and receiving the same input signal as transconductance amplifier 14 is connected between the unity-gain buffer 22 and the impedance element 16. Because the transconductance amplifiers 14 and 30 are substantially equal to each other and receive the same input, the current sourced or sunk by the feed-forward amplifier 30 equals the current sunk or sourced by the input transconductance amplifier 14. As a result, the buffer 22 does not need to supply any current through the feedback impedance 16 and thus, there is no voltage drop across the output impedance 24 of the buffer 22.

Ignoring any output impedance associated with the op-amp, the transfer function for the circuit of FIG. 3 can be written as:

$$\frac{V_O}{V_I} = \left(-\frac{G_m}{Y}\right) \quad \text{(Equ. 4)}$$

In other words, the addition of the feed-forward current in the feedback path relieves the feedback buffer of the need to supply any current exceeding parasitic losses. Removing the buffer would result in a circuit similar to that in FIG. 2. However, the addition of the buffer, as supplemented by the use of the injected feed-forward current, advantageously turns the feed-back path into a unidirectional path. As a result, 1−s term in the numerator of Equ. 1 is cancelled when the feed-forward transconductance and input transconductance are equal. Adding the buffer by itself does improve the circuit but requires additional power. Using the feedfoward technique described herein, where a feed forward current is injected at output of the feedback buffer, the feedback buffer does not need to supply the feedback buffer, but instead can simply serve as a unidirectional gateway. As a result, the buffer can be made smaller, thus providing an overall power advantage when compared to circuits which include the buffer but not feedforward.

As in the circuit of FIG. 2, in a preferred embodiment of the circuit of FIG. 3, the op-amp 12 is a simple high-speed operational transconductance amplifier having a transconductance $g_m$ which is substantially larger than the $G_m$ of the input transconductance amplifiers 14. Most preferably, $g_m$ is at least 10-times greater than $G_m$. While a variety of impedances can be used in the feedback impedance 16 in the circuit of FIG. 3, in a particular embodiment, the impedance 16 is a capacitor.

While the invention has been particularly shown and described with reference to preferred embodiments thereof, it will be understood by those skilled in the art that various changes in formn and details may be made therein without departing from the spirit and scope of the invention.

We claim:

1. A feed-forward compensated negative feedback circuit comprising:

an operational amplifier with conductance gm and having an inverting and a non-inverting input and an output;

a non-capacitive impedance element connected between the output of the operational amplifier and the inverting input of the operational amplifier;

a first transconductance amplifier with conductance Gm and having an inverting and non-inverting input receiving an input signal and having an output connected to the inverting input of the operational amplifier; and a second transconductance amplifier with conductance substantially equal to Gm and having an inverting and non-inverting input receiving said input signal and having an inverted output connected to the output of the operational amplifier.

2. The circuit of claim 1, wherein said first and second transconductance amplifiers are substantially identical.

3. The circuit of claim 1, wherein gm is substantially greater than Gm.

4. The circuit of claim 1, wherein the operational amplifier, and the first and second transconductance amplifiers are implemented in MOS.

5. A feed-forward compensated negative feedback circuit comprising:

an operational amplifier with conductance gm and having an inverting and a non-inverting input and an output providing an output signal;

a unity-gain buffer connected to the output of the operational amplifier;

an impedance element connected between an output of the unity-gain buffer and the inverting input of the operational amplifier;

a first transconductance amplifier with conductance Gm and having an input receiving an input signal and having an output connected to the inverting input of the operational amplifier; and a second transconductance amplifier with conductance substantially equal to Gm, receiving said input signal, and having an inverted output connected between the unity-gain buffer and the impedance element.

6. The circuit of claim 5, wherein said first and second transconductance amplifiers are substantially identical.

7. The circuit of claim 5, wherein the impedance element comprises a capacitor.

8. The circuit of claim 5, wherein gm is substantially greater than Gm.

9. The circuit of claim 5, wherein the operational amplifier, unity gain buffer, and the first and second transconductance amplifiers are implemented in MOS.

* * * * *